US009224899B2

(12) United States Patent
Peytavit et al.

(10) Patent No.: US 9,224,899 B2
(45) Date of Patent: Dec. 29, 2015

(54) LIGHT MIXER FOR GENERATING TERAHERTZ RADIATION

(75) Inventors: Emilien Peytavit, La Madeleine (FR); Jean-François Lampin, Templeuve (FR)

(73) Assignee: Centre National de la Recherche Scientifique, Paris (FR)

( * ) Notice: Subject to any disclaimer, the term of this patent is extended or adjusted under 35 U.S.C. 154(b) by 0 days.

(21) Appl. No.: 13/394,734

(22) PCT Filed: Sep. 3, 2010

(86) PCT No.: PCT/FR2010/000600
§ 371 (c)(1),
(2), (4) Date: Apr. 5, 2012

(87) PCT Pub. No.: WO2011/030011
PCT Pub. Date: Mar. 17, 2011

(65) Prior Publication Data
US 2012/0261577 A1    Oct. 18, 2012

(30) Foreign Application Priority Data
Sep. 9, 2009    (FR) .................................... 09 04298

(51) Int. Cl.
*G01J 5/20*    (2006.01)
*H01L 31/09*   (2006.01)
(52) U.S. Cl.
CPC .................................... *H01L 31/09* (2013.01)
(58) Field of Classification Search
None
See application file for complete search history.

(56) References Cited

U.S. PATENT DOCUMENTS

| 5,455,421 A | 10/1995 | Spears |
| 5,512,763 A | 4/1996 | Allam |
| 2003/0231683 A1* | 12/2003 | Chua et al. ..................... 372/46 |
| 2010/0033709 A1 | 2/2010 | Lampin et al. |

FOREIGN PATENT DOCUMENTS

FR    2 908 931 A1    5/2008

OTHER PUBLICATIONS

S. Gupta et al. "Subpicosecond carrier lifetime in GaAs grown by molecular beam epitaxy at low temperatures", Appl. Phys. Lett. 59, 3276 (1991).*
International Search Report and Written Opinion for Application No. PCT/FR2010/000600 dated Feb. 10, 2012.
(Continued)

*Primary Examiner* — David Porta
*Assistant Examiner* — Edwin Gunberg
(74) *Attorney, Agent, or Firm* — Alston & Bird LLP

(57) ABSTRACT

The invention relates to a light mixer for generating terahertz radiation, comprising a photodetector (PHD) coupled to an antenna (AT) for terahertz radiation, characterized in that the photodetector comprises a layer of photoconductive material capable of absorbing optical radiation, said layer having a thickness that is less than the absorption length of said radiation by the photoconductive material and being contained between an at least partially transparent so-called upper electrode and a reflective so-called lower electrode, said lower and upper electrodes comprising a resonant cavity for said optical radiation. The invention further relates to a terahertz radiation source comprising such a light mixer and to two laser radiation sources arranged to stack two laser radiation beams on the upper electrode of the photodetector. The invention also relates to the use of such a light mixer for generating terahertz radiation via light mixing.

17 Claims, 5 Drawing Sheets

(56) References Cited

OTHER PUBLICATIONS

Peytavit, E. et al., *An Ultra-Wide Bandwidth Photomixer With Down Conversion at Terahertz Frequency*, Proceedings of the Tenth IEE International Conference on Terahertz Electronics (2002) 23-26.

Taylor, Z. D. et al., *Resonant-Optical-Cavity Photoconductive Switch With 0.5% Conversion Efficiency and 1.0 W Peak Power*, Optics Letters, vol. 31, No. 11 (2006) 1729-1731.

Brown, E. R. et al., *Photomixing Up to 3.8 THz in Low-Temperature-Gown GaAs*, Appl. Phys. Lett. 66 (1995) 285.

Feiginov, M. N., *Analysis of Limitation of Terahertz P-I-N Uni-Traveling-Carrier Photodiodes*, J. Appl. Phys. 102 (2007) 084510.

Ito, H. et al., *Photonic Terahertz-Wave Generation Using Antenna-Integrated Uni-Traveling Carrier Photodiode*, Electronics Letters, vol. 39, No. 25 (2003) 1828-1829.

Michael, E. A. et al., *Large-Area Traveling-Wave Photonic Mixers for Increased Continuous Terahertz Power*, Appl. Phys. Lett. 86 (2005) 111120.

Mikulics, M. et al., *Traveling-Wave Photomixer With Recessed Interdigitated Contacts on Low-Temperature-Grown GaAs*, Appl. Phys. Lett. 88 (2006) 041118.

Verghese, S. et al., *Optical and Terahertz Power Limits in Low-Temperature-Grown GaAs Photomixers*, Appl. Phys. Lett. 71 (1997) 2743.

\* cited by examiner

LIGHT MIXER FOR GENERATING TERAHERTZ RADIATION

FIELD OF THE INVENTION

The invention relates to a photomixer and to a source of THz radiation based on such a photomixer.

BACKGROUND

The term "THz radiation" is used to mean electromagnetic radiation at a frequency lying approximately in the range 100 gigahertz (GHz) to 10 terahertz (THz), where 1 THz=$10^{12}$ hertz (Hz), which corresponds to wavelengths lying in the range approximately 3 millimeters (mm) to 30 micrometers ($\mu m$). This spectrum range that is situated between the optical range and the microwave range has been under-used for a long time, in particular because of the lack of suitable sources and detectors.

Use of THz radiation is nowadays being actively developed both industrially and commercially. The main application lies in THz spectroscopy. Thus, the first commercial broadband THz spectroscopy systems have already appeared on the market. Amongst the pioneering companies in this field, mention may be made of Picometrix (USA), Teraview (UK) in co-operation with Brucker Optics, Nikon (Japan), Kwele (France), Gigaoptics (Germany), Tray-science (Canada), and Eskpla (Lithuania). Some of those firms also sell antennas for generating and detecting THz pluses: Eskpla, Gigaoptics, or indeed Tray-science.

All of those spectroscopy systems make use of a so-called "pump-probe" technique that relies on a femtosecond (fs) pulse laser that makes it possible to perform measurement over a broad spectrum band, but at low resolution (>1 GHz). That technique is capable of generating and detecting electromagnetic pulses having a duration of picosecond (ps) order and thus including spectrum components extending up to several THz.

Another technique of generating THz radiation that is highly promising for spectroscopic applications is photomixing, i.e. mixing two infrared lasers on an ultrafast photodetector.

The two superposed laser beams at frequencies $f_1$ and $f_2$ generate peaks at the frequency $f=|f_1-f_2|$, that is selected to lie in the THz range (100 GHz≤f≤10 THz). The photocurrent generated by the photodetector has a constant term and an oscillating term of frequency f: $I=I_0(1+\cos(2\pi ft))$. The photodetector is coupled to an antenna that transmits electromagnetic radiation of frequency f. The assembly constituted by the photodetector and the antenna is referred to as a "photomixer".

That technique was described for the first time in the article by E. R. Brown, K. A. McIntosh, K. B. Nichols, and C. L. Dennis entitled "Photomixing up to 3.8 THz in low-temperature-grown GaAs", Appl. Phys. Lett. 66, 285 (1995). It has the advantage of presenting better spectral resolution (<1 GHz) and of being potentially portable since it can be used with semiconductor laser diodes in the range 700 nanometers (nm) to 1600 nm (0.7 $\mu m$-1.6 $\mu m$) depending on the photodetector used.

The photodetectors normally used for generating THz radiation by photomixing are mainly:

at $\lambda$=0.7 $\mu m$-0.8 $\mu m$: photoresistances using a material having a short lifetime such as gallium arsenide grown epitaxially at low temperature (LT-GaAs);

at $\lambda$=1.55 $\mu m$-1.6 $\mu m$: uni-traveling carrier photodiodes (UTC photodiodes) or photoresitances using a material having a short lifetime such as irradiated InGaAs; and at $\lambda$=0.8 $\mu m$-1.06 $\mu m$, wavelengths at which ytterbium-doped optical fiber amplifiers operate, LT-GaSb$_x$As$_{1-x}$ photoresistances (with 0<x<1, the value of x serving to modify the absorption band of the material).

The generation performance that is obtained is generally of the order of 1 microwatt ($\mu W$) at 1 THz for an optical power of the order of 50 milliwatts (mW) to 100 mW, whether at 0.8 $\mu m$ or at 1.55 $\mu m$. The best results at 1 THz (2.6 $\mu W$ at 1.05 TRz in 2003) have been obtained at 1.55 $\mu m$ with a UTC diode coupled to a log-periodic antenna: see the article by H. Ito, F. Nakajima, T. Furuta, K. Yoshino, Y. Hirota, T. Ishibashi entitled "Photonic terahertz-wave generation using antenna-integrated uni-traveling carrier photodiode", Electronics Letters, Vol. 39, No. 25, pp. 1828-1829, Dec. 11, 2003.

LT-GaAs photodetectors generally possess a planar structure constituted by interdigitated metal electrodes deposited on an epitaxial layer of LT-GaAs (see FIG. 1). A typical photodetector is made up of five metal electrodes having a width of 0.4 $\mu m$ and a length of 10 $\mu m$, which electrodes are separated by 1.8 $\mu m$. The total area of the photodetector is 88 square micrometers ($\mu m^2$).

The powers emitted by the photomixers, of the order of 1 $\mu W$ at 1 THz, are still much too small for spectroscopy type applications. The only broadband detectors that are sufficiently sensitive to detect this level of power with a good signal-to-noise ratio (>1000) are bolometric detectors operating at 4 kelvins (K). An increase in the power generated would make it possible to use detectors at ambient temperature.

The THz power emitted by existing photodetectors is limited by thermal effects, such as the effects described by S. Verghese, K. A. McIntosh, and E. R. Brown in the article entitled "Optical and terahertz power limits in low-temperature-grown GaAs photomixers", Appl. Phys. Lett. 71, 2743 (1997). For a given bias voltage, when optical power is increased progressively, photodetector destruction occurs before saturation phenomena appear, whether in terms of direct current (DC) or of THz power.

It would appear to be obvious to increase the surface area of the photodetectors in order to overcome those power limits. Nevertheless, if the transverse dimensions of the photodetector are not small compared with the wavelength of THz radiation, the contributions of the various surface elements of the detector can interfere destructively. To avoid that effect, recourse is had to so-called "distributed" planar structures, in which the photodetector is integrated in a THz waveguide. See for example:

E. A. Michael, B. Vowinkel, R. Schieder, M. Mikulics, M. Marso, and P. Kordos "Large-area traveling-wave photonic mixers for increased continuous Terahertz power", Appl. Phys. Lett. 86, 111120 (2005); and M. Mikulics, E. A. Michael, R. Schieder, J. Stutzki, R. Gusten, M. Marso, A. van der Hart, H. P. Bochem, H. Luth, and P. Kordos, "Traveling-wave photomixer with recessed interdigitated contacts on low-temperature-grown GaAs" Appl. Phys. Lett. 88, 041118 (2006).

Unfortunately, the complexity of such structures does not enable their full potential to be used. The maximum power generated at 1 THz is of the order of 1 $\mu W$, i.e. substantially the same as for a "point" photodetector, but with much smaller efficiency.

SUMMARY OF THE INVENTION

The invention seeks to overcome the above-mentioned limitations of the prior art, in particular in terms of the maximum power that is generated.

In accordance with the invention, such an object is achieved by a photomixer for generating THz radiation, the photomixer comprising a photodetector coupled to an antenna for THz radiation, the photomixer being characterized in that the photodetector comprises a layer of photoconductive material suitable for absorbing optical radiation, said layer presenting a thickness less than the absorption length of said radiation by the photoconductive material and extending between a so-called "top" electrode that is at least partially transparent and a so-called "bottom" electrode that is reflective, said bottom and top electrodes forming a resonant cavity for said optical radiation. In addition to their optical function, the electrodes serve to bias the detector by applying a voltage to the structure. Such a photomixer presents thermal properties that are better than the thermal properties of prior art devices, and it can therefore operate at higher power levels.

Document U.S. Pat. No. 5,455,421 describes an infrared detector presenting a structure similar to that of the photodetector used in the photomixer of the s invention. In that document, it is recommended to use a thin active layer that is inserted in the resonant cavity in order to increase the sensitivity of the detector and in order to reduce its noise level. Those are considerations that are not pertinent for use as a THz photomixer.

Particular embodiments of the photomixer of the invention constitute the subject matter of dependent claims.

The invention also provides a THz radiation source comprising such a photomixer and at least one laser radiation source arranged to direct two superposed beams of laser radiation onto the top electrode of the photodetector, said beams of laser radiation presenting a frequency difference lying in the range 100 GHz to 10 THz.

The invention also provides the use of a photomixer as described above for generating THz radiation by photomixing.

The invention makes it possible to generate THz radiation with power of the order of 1 mW to a few milliwatts, i.e. an increase of three orders of magnitude compared with the prior art.

BRIEF DESCRIPTION OF THE DRAWINGS

Other characteristics, details, and advantages of the invention appear on reading the description made with reference to the accompanying drawings given by way of example and, in which.

DETAILED DESCRIPTION

Figure 1:
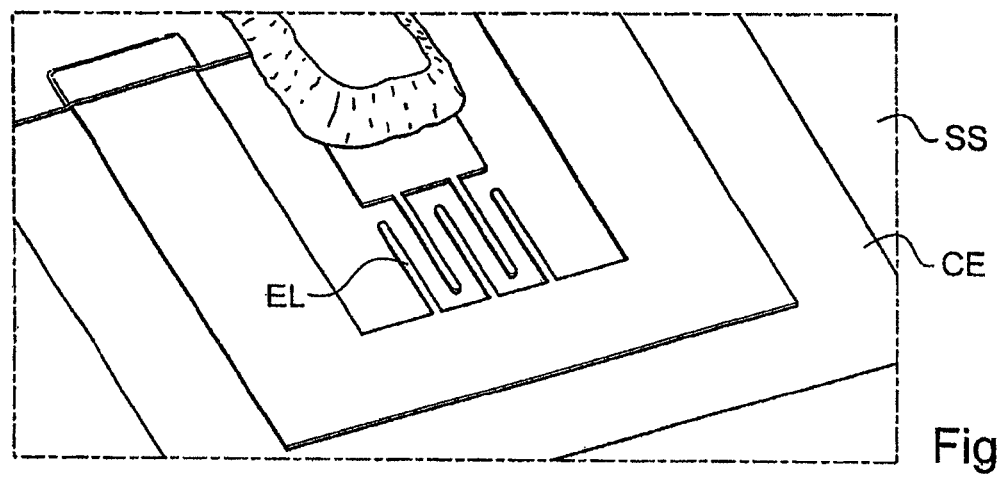
FIG. 1 is a scanning electron microscope image of a prior art ultrafast photodetector.

FIG. 1 is a scanning electron microscopic image of a known ultrafast detector of the prior art that comprises:π an epitaxial layer CE of LT-GaAs deposited on a substrate SS of semi-insulating GaAs; and five interdigitated metal electrodes EL deposited on said layer CE, presenting a width of 0.4 μm and a length of 10 μm, and spaced apart by 1.8 μm so as to define an active area of 88 μm².

To a first approximation, the power generated at a frequency f in the THz range by a photomixer based on the FIG. 1 detector is given by:

$$P_{THz} = \frac{1}{2} \frac{R_A I_0^2}{(1 + (\omega R_A C)^2)(1 + \omega^2 \tau^2)}$$

where:

$I_0$ is the DC photocurrent;

$R_A$ is the radiation resistance, which depends on the antenna coupled to the photodetector;

C is the capacitance of the electrodes;

τ is the lifetime of the photogenerated carriers; and

ω=2πf.

This equation shows that the passband of the photodetector is governed by two characteristic times:

τ, the lifetime of the carriers, which is a characteristic of the photoconductive material; and $R_A C$, which is an electrical time constant.

Two cutoff frequencies, $fc_1 = 1/(2\pi\tau)$ and $fc_2 = 1/(2\pi R_A C)$ are associated with these time constants.

The gain of the photodetector is given by $R_A I_0^2$.

An intrinsic response coefficient of the photodetector $\mathfrak{R}(V)$ may be defined as follows:

$$I_0 = \mathfrak{R}(V) \times \eta_{opt} \times P_0 = \mathfrak{R}(V) \times P_{abs}$$

where $\mathfrak{R}(V)$ increases with increasing bias voltage V up to $\mathfrak{R}_m$ at a voltage $V_m$ that enables the carriers to reach saturation speed.

The optical efficiency $\eta_{opt}$ is defined as being the ratio between the incident optical power ($P_0$) and the power absorbed by the photoconductive material ($P_{abs}$) that serves to create electron-hole pairs:

$$\eta_{opt} = \frac{P_{abs}}{P_0}.$$

Furthermore, for simplification purposes, if it is assumed that the electric field is constant between the electrodes, the following applies:

$$V_m = E_{0sat} \times d$$

where:
d is the inter-electrode spacing; and
$E_{0sat}$ is the electric field for carrier speed saturation.

A passband reaching THz is obtained by using a photoconductor in which the photogenerated carriers present lifetimes shorter than one picosecond, such as GaAs grown epitaxially at low temperature, and by limiting the capacitance of the comb of metal electrodes to a few femtofarards (fF). In addition, the dimensions of the photodetector must be less than about ten micrometers in order to limit interference phenomena between the currents generated by the different surface elements of the active layer. Since the impedance of the antennas is generally of the order of 50 ohms (Ω) to 100Ω, the constant $R_A C$ is also less than one picosecond. More precisely, the FIG. 1 planar photodetector has the following characteristics:

200 fs<τ<1 ps ⇒ 160 GHz<$fc_1$<800 GHz;
0.5 fF<C<3 fF, $R_A$≈50Ω, 25 fs<$R_A C$<150 fs;
6000 GHz>$fc_2$>1000 GHz;
d≈2 μm;
$\mathfrak{R}_m$≈0.01 amps per watt (A/W) to 0.04 A/W and $\eta_{opt}$≈1 with an antireflection layer; and
$P_0$≈100 mW before thermal destruction, $I_0$≈1 mA to 2 mA, and $V_m$≈20V.

For f=1 THz the power generated is: $P_{THz}$≈1 μW.

It is thus possible to define a conversion efficiency $\eta_g$ which is the ratio of the emitted THz power to the sum of the electrical and optical powers that are supplied:

$$\eta_g = \frac{P_{THz}}{I_0 \times V_m + P_0}$$

For prior art photoconductors $\eta_g$≈0.001%.

Thermal destruction of the component occurs for a temperature rise $\Delta T_m$ relative to ambient temperature that is reached for an absorbed power $P_{absm}$. From thermal equations under steady conditions:

$$\Delta T_m = P_{th} \times R_{th}$$
$$\Delta T_m = R_{th}(P_{absm} + I_{0m} \times V_m)$$
$$\Delta T_m = R_{th} \times I_{0m}\left(\frac{1}{\mathfrak{R}_m} + V_m\right)$$

where $R_{th}$ is the thermal resistance connecting the photodetector with thermal ground that remains at ambient temperature (the back of the substrate), while $P_{th}$ is the thermal power dissipated in the photoconductor, being the sum of the power absorbed in the photodetector ($P_{abs}$) plus the Joule power $P_{Joule} = I_0 \times V_m$. The maximum photocurrent $I_{0m}$ can be deduced therefrom:

$$I_{0m} = \frac{\Delta T_m}{R_{th}\left(\frac{1}{\mathfrak{R}_m} + V_m\right)}$$

providing the cutoff frequencies are kept constant:

$$P_{THz} \propto I_0^2$$

Furthermore, for unchanging material, $\Delta T_m$ is constant, i.e.:

$$P_{THzm} \propto \frac{1}{\left[R_{th}\left(\frac{1}{\mathfrak{R}_m} + V_m\right)\right]^2}$$

In order to exceed one microwatt at THz, it is therefore essential to optimize the following:

1. The ratio of the THz power as emitted to the thermal power generated in the photodetector. Assuming that $\eta_{opt}$ is constant, this amounts to optimizing the conversion efficiency $\eta^g$. It suffices to replace $P_0$ with $P_{abs}$ in order to change from one to the other.
It is therefore necessary to increase $\mathfrak{R}_m$ and to decrease $V_m$.

2. Evaluating thermal power in order to limit the temperature rise of the photodetector. This amounts to decreasing the thermal resistance $R_{th}$ between the photodetector and its environment.

The present inventors have shown that for a given photoconductive material:

$$\mathfrak{R}_m \propto \frac{1}{d}$$
$$V_m \propto d$$

where d is the interelectrode distance. This is explained below with reference to the photodetector of the invention, however the result is equally applicable to the photodetector of the prior art.

Figure 2:
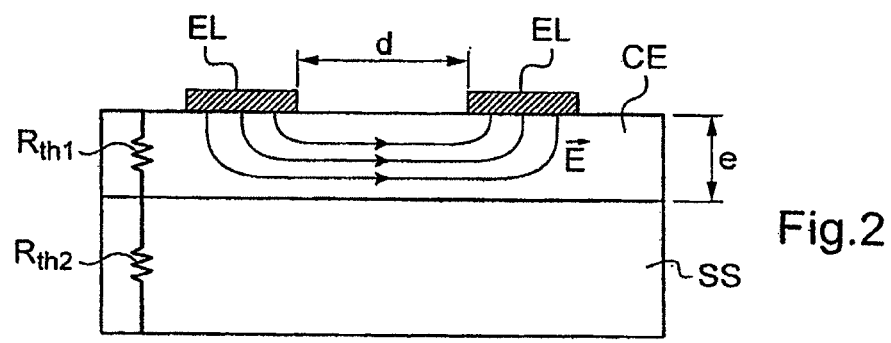
FIG. 2 is a diagrammatic section view of the FIG. 1 photodetector.

With a planar photodetector as shown in FIGS. 1 and 2, the interelectrode distance d and the thickness e of the active layer CE depend on the absorption length (Lα) in the photoconductive material (LT-GaAs), which length is about 0.7 μm (at 1/e, where this "e" is the base of natural logarithms), for a wavelength of λ=0.8 μm.

Thus, it is necessary for e to be approximately equal to at least 2 μm in order to optimize the optical efficiency $\eta_{opt}$ and also, and above all, in order to limit absorption in the epitaxial substrate SS of semi-insulating GaAs. In the substrate, carriers have a lifetime that is longer by a factor of 100 to 1000 compared with the lifetime in LT-GaAs. Thus even a small portion of the incident optical power reaching the substrate is capable of generating a high density of carriers therein and a non-modulated current density under bias that would be destructive.

It is also necessary for d to be approximately equal to at least 2 μm in order to have a static electric field in the absorption zone that is uniform. Applying a potential difference between two conductive electrodes placed on the surface of a semiconductor, which is considered as being a dielectric, produces a non-negligible static electric field over a depth that is practically equal to the interelectrode spacing (see the force lines of the electric field $\vec{E}$ as shown in FIG. 2). Thus, in order to have a non-negligible electric field over a depth e of 2 μm, the interelectrode spacing d must be close to that value.

It can be seen that the structure of a conventional photodetector does not enable the interelectrode distance d to be reduced below a certain value (2 μm in the example described), and thereby increase $\mathfrak{R}_m$ and/or decrease $V_m$.

From a thermal point of view, the total thermal resistance $R_{th}$ may be seen as being the sum of two thermal resistances in series ($R_{th1}+R_{th2}$), where $R_{th1}$ is the contribution of the photoconductive active layer and $R_{th2}$ is the contribution of the substrate. The contribution $R_{th1}$ depends on the thickness e of the active layer CE; this contribution is large because LT-GaAs has low thermal conductivity (20 watts per meter per degree kelvin (W/m/K)). Once more, the fact of not being able to reduce this below a certain value (2 µm in the example under consideration) limits any possibility of increasing the THz power generated by a prior art photodetector.

Figure 3:
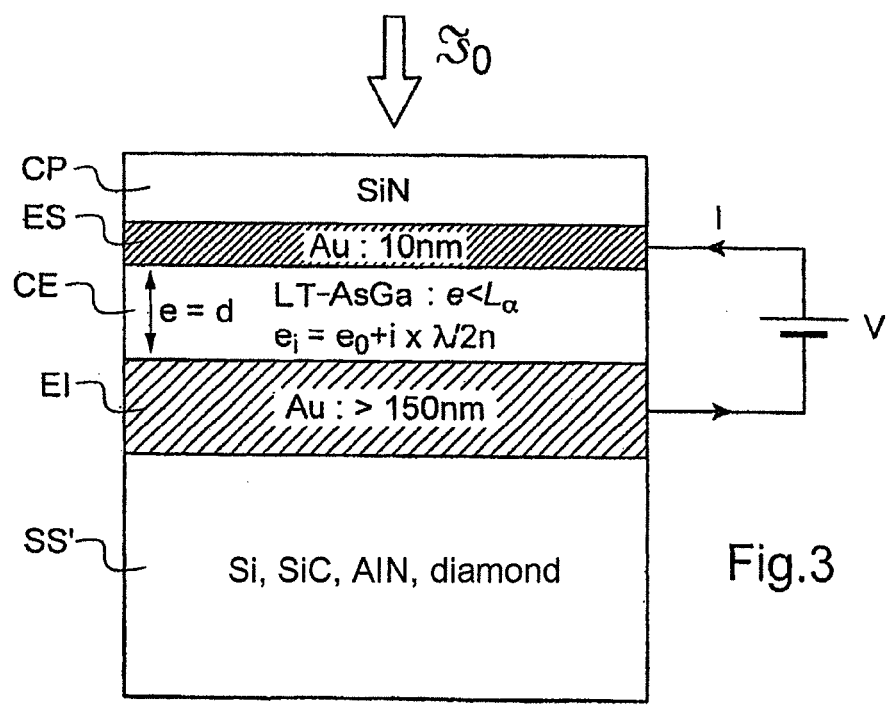
FIG. 3 is a diagrammatic section view of a photodetector in an embodiment of the invention.

The photodetector of the invention, of structure that is shown in FIG. 3, enables the interelectrode spacing d and the thickness e of the active layer to be reduced, thereby optimizing the values of $\mathfrak{R}_m$, $V_m$, and $R_{th}$, and consequently enables the THz power that can be generated by the photomixer to be optimized.

In this structure, the active layer CE of LT-GaAs or of some other appropriate photoconductive material is sandwiched between two layers (ES and EI) of a metal that presents little loss in the infrared, such as gold, silver, or even copper. These two metal layers have two roles. They have an electrical role since they serve as electrodes for biasing the photoconductor, and they also have an optical role since they form a resonant optical cavity. The bottom electrode EI acts as a metal mirror, while the layer ES is semitransparent because of its small thickness, and enables the transmission of optical power into the cavity to be modulated. The thickness e of the layer and the interelectrode distance d in this example coincide and may be selected such that $e=d<L_\alpha$. By resonant absorption, it is possible to have optical efficiency that is close to unity in spite of having a thickness that is small. It is possible to add an infrared-transparent dielectric layer CP on the surface for the purpose of passivating the component and/or of adjusting the optical properties of the resonant cavity (an antireflection coating, or on the contrary a reflective coating). By way of example, this layer may be made of silicon nitride ($Si_xN_y$) or indeed of silicon oxide ($Si_xO_y$).

The top electrode ES may even be perfectly transparent: under such circumstances, it is the electrode/air interface or the CP/air layer that provides the partial reflection of the infrared radiation that makes optical resonance possible.

The structure also makes it possible to apply the LT-GaAs epitaxial layer onto another substrate SS' by Au—Au thermocompression or by soldering using an Au—In or an Au—Sn eutectic. The buried metal electrode may thus also act as a "bonding" layer between the epitaxial layer and a host substrate that is selected for its thermal properties. Advantageously, the substrate SS' may be selected to have thermal conductivity that is higher than that of the GaAs used in the FIG. 1 device (thermal conductivity of GaAs=45 W/m/K).

In order to make such a structure, and starting from an GaAs substrate, a layer of GaInP is deposited epitaxially on the substrate followed by a layer of LT-GaAs. Thereafter the GaAs layer is metallized with a deposit of gold, as is the host substrate SS' (Si, SiC, . . . ) on which the detector is to be transferred. The two metallized faces are then put into contact, and a pressure of several tens of bars (typically about 20 bar) is applied at a temperature lying in the range approximately 200° C. to 340° C. for a period of several hours, typically 1 hour (h) to 2 h (thermocompression), thereby bonding the two substrates together. At this point, the GaAs substrate is etched with a chemical solution (e.g. a mixture of $H_2O_2$ and of $H_2SO_4$) with etching stopping on the layer of GaInP. This layer is etched in turn with a second chemical solution (e.g. a solution of HCl) that does not attack LT-GaAs. This thus produces a layer of LT-GaAs that has been transferred onto the host substrate by means of a layer of Au. Thereafter it only remains to deposit the layers constituting the semitransparent or transparent top electrode and the dielectric coating, if any.

Advantageously, the thermal conductivity of the material constituting the substrate SS' may be greater than 100 W/m/K. For example, this material may be Si (130 W/m/K), (6H) SiC (490 W/m/K), or ideally diamond (1100 W/m/K).

The substrate SS' has no influence in optical terms since the bottom electrode EI is selected so as to be totally reflective. The substrate also has no influence in electrical terms, since the bottom electrode EI also constitutes electromagnetic shielding.

Another advantage of the FIG. 3 structure is that infrared radiation is absorbed in practically uniform manner over the entire thickness of the active layer CE, which is not true of the prior art planar structure. It is possible to show (as can be seen below) that uniform absorption over the entire thickness of the layer is most advantageous from a thermal point of view.

By way of example, the FIG. 3 photodetector comprises:

a thick substrate SS' of Si, SiC, or diamond;

a bottom electrode EI of gold (Au) having a thickness greater than 150 nm, e.g. 700 nm;

a layer CE of LT-GaAs having a thickness e that is less than one micrometer (the question of the thickness of this layer is investigated in greater detail below);

a top electrode ES of gold having a thickness of 10 nm; and a passivation layer CP of SiN.

In such a structure, the distance d between the electrodes EI and ES is necessarily equal to e.

This detector, of the photodetection type, has been subjected to optical, thermal, and electrical modeling, and also to experimental studies in order to determine its performance.

The optical modeling was performed for optical (infrared) radiation at normal incidence on the detector, thus making it possible to take into consideration only one component of the E and H fields. In addition, the problem was considered unidimensionally (since the physical magnitudes depend only on depth z).

Figure 10:
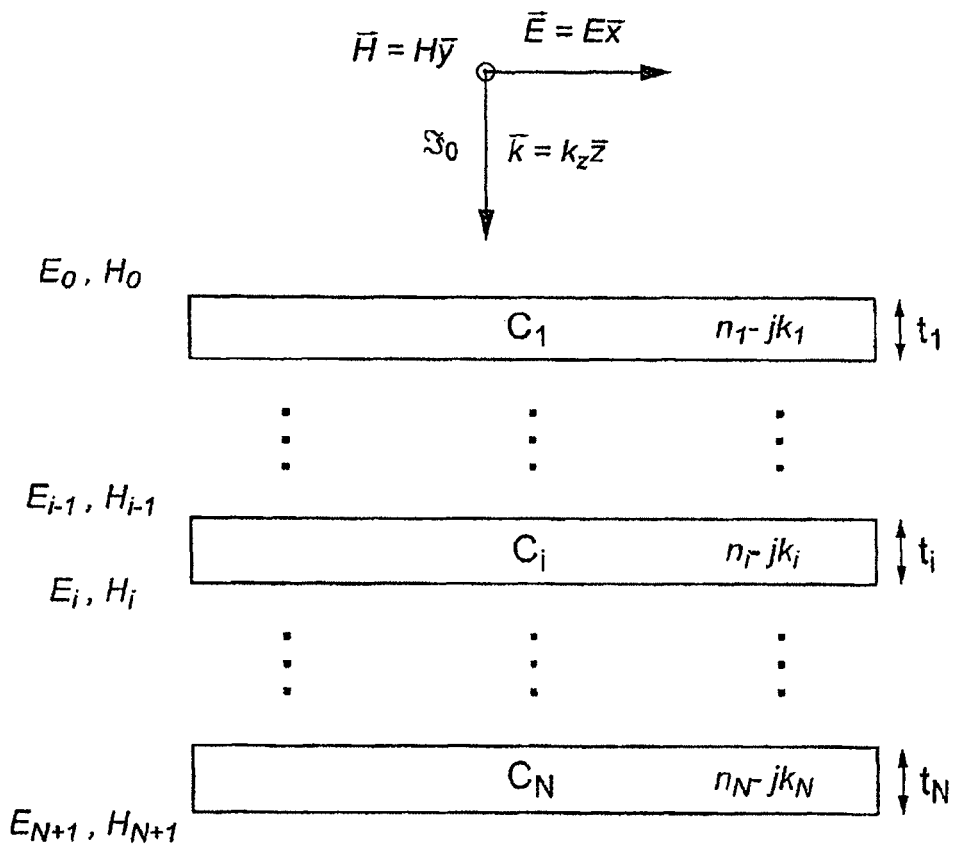
FIG. 10 is a diagram showing the transfer matrix method used for optical modeling of a photodetector in an embodiment of the invention.

The surface photodetector S, taken to be a stack of thin layers $C_1, \ldots, C_i, \ldots, C_n$, each characterized by a respective thickness $t_1, \ldots, t_i, \ldots, t_n$, and by a respective complex refractive index (see FIG. 10) is illuminated uniformly by a beam of power $P_0$. The incident power density $\mathfrak{I}_0=P_0/S$.

The modeling is based on the transfer matrix method that is well known in optics. In this approach, the electric and magnetic fields ($\vec{E}, \vec{H}$) on either side of each layer of the structure are associated by a 2×2 matrix. Because of the continuity of the tangential components of the fields, the overall characteristics of the structure are then obtained by multiplying matrices corresponding to each of the layers. Thus, for a layer of thickness d, of complex index $n_c=n-jk$ (for a wavelength $\lambda$) and of wave impedance $$Z = \frac{Z_0}{n-jk}$$

with $Z_0=377\Omega$ being the characteristic impedance of empty space, the following applies:

$$\begin{bmatrix} E_i \\ H_i \end{bmatrix} = \begin{bmatrix} \cos\left(\frac{2\pi d}{\lambda}(n-jk)\right) & \frac{j}{Z}\sin\left(\frac{2\pi d}{\lambda}(n-jk)\right) \\ jZ\sin\left(\frac{2\pi d}{\lambda}(n-jk)\right) & \cos\left(\frac{2\pi d}{\lambda}(n-jk)\right) \end{bmatrix} \begin{bmatrix} E_{i-1} \\ H_{i-1} \end{bmatrix}$$

With this method, for a given incident optical power density $\mathfrak{I}_0$ (in watts per square meter (W/m$^2$)), the complex scalar quantities E and H are calculated at each interface and also continuously within the structure. This then makes it possible to have the optical power density $\mathfrak{I}(z)$ that propagates within the structure on the basis of Poynting's theorem:

$$\mathcal{J}(z)\vec{z} = \frac{1}{2}\text{Re}(E\vec{x} \times H^*\vec{y})$$

$$\mathcal{J}(z)\vec{z} = \frac{1}{2}\text{Re}(EH^*)$$

where "*" represents the complex conjugation operator.

The power density $\Pi_{abs}(z)dz$ that is absorbed in a slice of thickness dz in the z direction is given by:

$$\Pi_{abs}(z)dz = -\mathcal{J}(z+dz) + \mathcal{J}(z) \Rightarrow \Pi_{abs}(z) = -\frac{\mathcal{J}(z+dz) - \mathcal{J}(z)}{dz} \Rightarrow \lim_{dz \to 0} \Pi_{abs}(z) = -\frac{d\mathcal{J}(z)}{dz}$$

where $\Pi_{abs}(z)$ is the density (per unit volume) of power absorbed at each point in the structure and is expressed in watts per cubic meter (W/m$^3$). It then suffices to integrate $\Pi_{abs}(z)$ over the layer $C_i$ in order to have the power that is absorbed in that layer.

Figure 4:
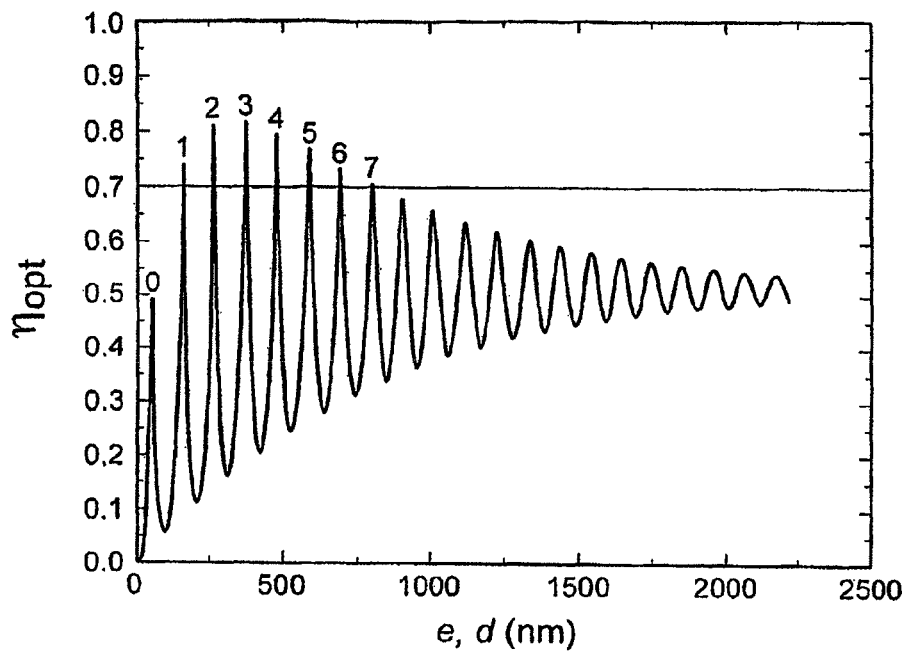
FIG. 4 is a graph showing the way the optical efficiency of the FIG. 3 photodetector depends on the thickness of its layer of photoconductive material.

FIG. 4 shows the optical efficiency $\eta_{opt}$ of the FIG. 3 detector as calculated by the transfer matrix method as a function of e. It can be seen that the plot of $\eta_{opt}$ is in the form of a plurality of resonance peaks, which can be understood on observing that, from an optical point of view, the FIG. 3 structure constitutes a Fabry-Perot etalon. Let $e_0$ be the thickness that corresponds to resonance of order zero; then the resonance peak of order i corresponds to a thickness $e_i = e_0 + i \cdot \lambda/2n$, where n is the real part of the refractive index of the active layer CE. In the example of FIG. 4, $e_0 = 47$ nm, $\lambda/2n \approx 105$ nm, and thus $e_1$, $e_2$, $e_3$, etc., are equal respectively to 152 nm, 257 nm, 362 nm, etc. In FIG. 4, it can be seen that the absorption in the photoconductor is greater than 70% of the incident optical power for $e_{1 \leq i \leq 7}$.

Thus, compared with the planar structure in which e=2000 nm, for $e_1=152$ nm there is obtained an improvement of a factor of $2000/152 \approx 13$ for $\mathfrak{R}_m$ and $V_m$, where there is a deterioration for $\eta_{opt}$ by a factor of $0.7/1 = 0.7$ compared with the same planar structure, assuming that it has maximum optical efficiency ($_{\eta opt}=1$).

For the application to generating THz radiation, it is necessary for the spectrum width of the resonances to be broad enough to enable photomixing of two different optical wavelengths. Thus, it is necessary for the width at half maximum of the resonance peaks to be not less than 100 GHz, and preferably not less than 1 THz. This condition is well satisfied in the example of FIG. 4, where absorption varies by only 1% to 2% on going from $\lambda=0.77$ μm to 0.79 μm, which corresponds to a frequency difference $f \approx 10$ THz.

Figure 11:
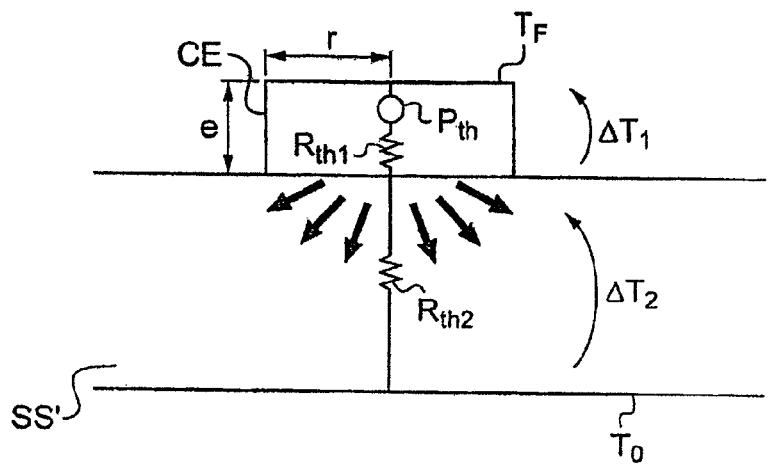
FIG. 11 is a diagrammatic section view of a photodetector in an embodiment of the invention, for showing how it is modeled thermally.

In order to calculate thermal resistance, the photodetector has been modeled assuming that it is cylindrical with an area S, a radius r, and a height substantially equal to e, associated with a heat source of thermal power $P_{th}$ connected to a thermal ground via a thermal resistance $R_{th} = R_{th1} + R_{th2}$ (see FIG. 11). The temperature rise $\Delta T = T_f - T_0 = R_{th} \times P_{th}$ may be seen as the sum of two rises $\Delta T_1 = R_{th1} \times P_{th}$ and $\Delta T_2 = R_{th2} \times P_{th}$, corresponding respectively to passing through the layer CE of LT-GaAs and to "spreading" in the substrate SS'.

Generally, r>>e, so to a first approximation it can be assumed that the temperature T depends only on depth z. $R_{th1}$ can thus be calculated by solving the following one-dimensional thermal equation:

$$k_{LT\text{-}GaAs} \frac{d^2 T}{dz^2} = \rho_{th}(z)$$

where $k_{LT\text{-}GaAs}$ is the thermal conductivity of the LT-GaAs, and $\rho_{th}$ is the power density in the photodetector such that:

$$S \times \int_0^e \rho_{th}(z)dz = P_{th}.$$

To a first approximation, it is possible to consider that the thermal power is generated solely at the surface of the photoconductor and that $\rho_{th}$ is thus zero for $z \neq 0$. $R_{th1}$ is then equal to:

$$R_{th1} = \frac{e}{k_{LT\text{-}GaAs} \times S}.$$

Nevertheless, it can clearly be seen that the thermal resistance may decrease if the thermal power is generated over all of the LT-GaAs layer.

Thus, if $$\rho_{th}(z) = const = \frac{P_{th}}{S \times e}$$

then $$R_{th1} = \frac{1}{2} \frac{e}{k_{LT\text{-}GaAs} \times S}.$$

To take this phenomenon into account, it is possible to calculate the absorbed optical power density as a function of z, i.e. $\pi_{abs}(z)$ (see above) together with the Joule power density (see below):

$$\Pi_{Joule} = q \times (n_e + n_h) \times v_s \times E_0 = \Pi_{abs}(z) \times 2 \times q \times \tau \times \frac{1}{h\nu}$$

and thus:

$$\rho_{th}(z) = \Pi_{Joule}(z) + \Pi_{abs}(z) \times = \Pi_{abs}(z) \times \left(1 + 2 \times q \times \tau \times \frac{1}{h\nu}\right)$$

Once $\Delta T_1$ has been calculated, $R_{th1}$ is calculated by integrating $\rho_{th}$ over the entire volume of the photodetector:

$$R_{th1} = \frac{\Delta T_1}{\iiint \rho_{th} dV}$$

Since the dimensions of the photodetector (micrometers) are very small compared with the dimensions of the substrate (millimeters), the contribution $R_{th2}$ may be modeled as a so-called "spreading resistance" from a point source into a semi-infinite space. For a circular photodetector of radius r, the problem possesses cylindrical symmetry and $R_{th2}$ is then given by:

$$R_{th2} = \frac{1}{\pi r k_{substrate}}$$

Figure 5:
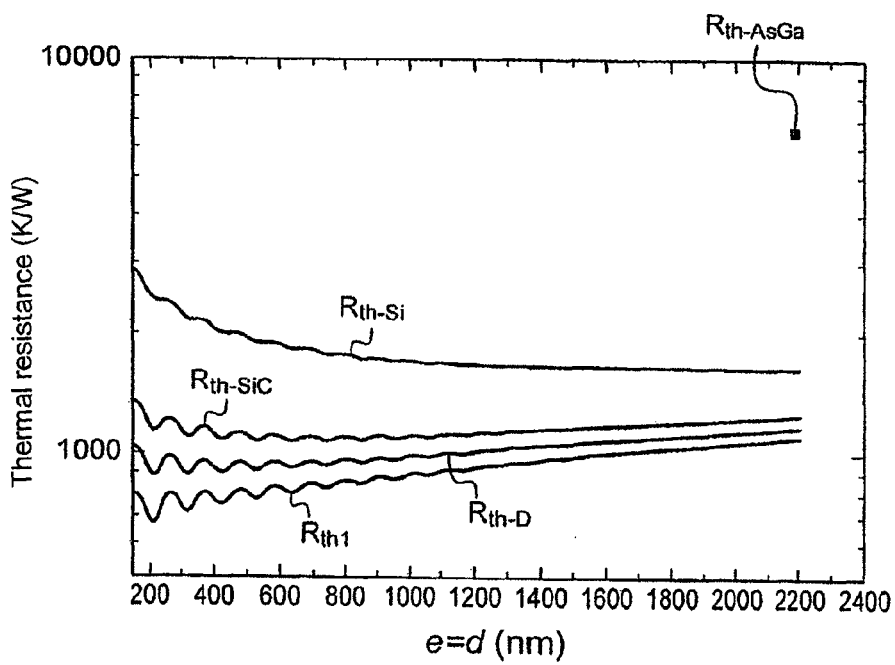
FIG. 5 is a graph showing the thermal resistance of the FIG. 3 photodetector as a function of the thickness of its layer of photoconductive material.

FIG. 5 shows the value calculated for the total thermal resistance of the resonant vertical photodetector of FIG. 3 using different substrate materials and as a function of the thickness of the active layer CE for a constant electrostatic capacitance C of 3.2 fF corresponding to a cutoff frequency $fc_2=1$ THz for $R_A=50\Omega$. Thus, the curves $R_{th1}$ represents the sole contribution of the active layer CE to the thermal resistance; the curve $R_{th-Si}$, $R_{th-SiC}$, and $R_{th-D}$ represent the total thermal resistance for a photodetector presenting a thick substrate of Si, SiC, or diamond, respectively. The point $R_{th-GaAs}$ refers to a detector of planar structure (see FIGS. 1 and 2) with a semi-insulating GaAs substrate of thickness $d=2.2$ µm.

To a first approximation, in the vertical surface of the invention, $R_{th1}$ is inversely proportional to the electrostatic capacitance C:

$$C = \frac{\varepsilon_0 \varepsilon_{rGaAs} S}{d} \text{ and } R_{th1} \approx \frac{d}{k_{LT-GaAs} S}$$

whence $$R_{th1} C \approx \frac{\varepsilon_0 \varepsilon_{rGaAs}}{k_{LT-GaAs}}$$

with:
$\varepsilon_{rGaAs}$ is the relative dielectric permittivity of LT-GaAs;
$\varepsilon_0$ is the dielectric permittivity of space;
S is the area of the resonant vertical photodetector; and
$k_{LT-GaAs}$ is the thermal conductivity of LT-GaAs.

Consequently, for constant C, $R_{th1}$ should not depend on e. Nevertheless, it can be seen in FIG. 5 that $R_{th1}$ is not entirely constant since, as explained above, it is preferable from a therMal point of view to absorb the optical power in uniform manner within the layer. Thus, $R_{th1}$ goes from 1100 K/W for d=2200 nm to approximately 700 K/W for d=150 nm. Furthermore, it can be seen that it is possible to decrease $R_{th}$ by a factor of 4 compared with the planar structure with SiC or diamond, and even by a factor of 2 on Si.

Figure 9:
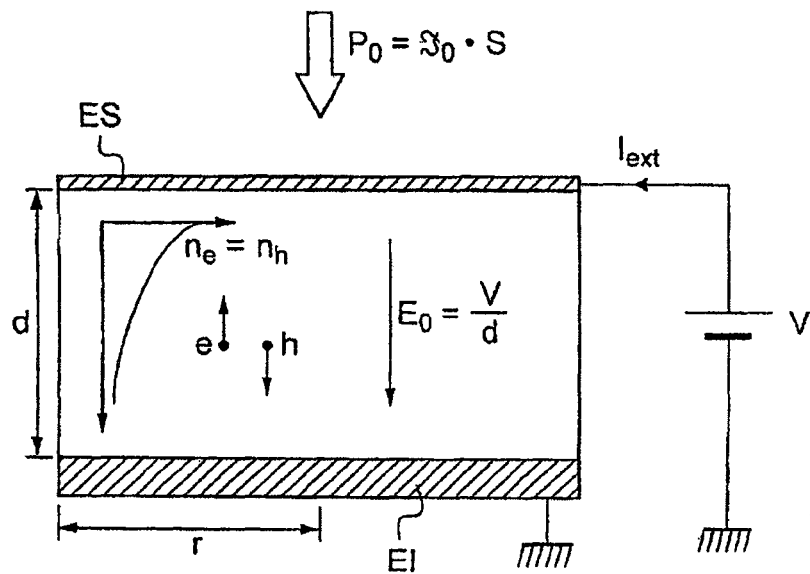
FIG. 9 is a diagrammatic section view of a photodetector in an embodiment of the invention, for illustrating how it is modeled electrically.

Electrical modeling, shown in FIG. 9, enables the response coefficient ($\mathfrak{R}$) of the FIG. 3 vertical photodetector to be calculated. In order to calculate the response coefficient $\mathfrak{R}$, it is necessary to solve the drift-diffusion and continuity equations in the semiconductor under illumination. In this example, when d<<2r, this may be reduced to a one-dimensional problem in which the physical magnitudes such as $n_e$ ($n_h$), electron (or hole) density, or $\mathfrak{I}$, i.e. optical power density depend only on depth z.

Furthermore, the effect of charge density $q \times (n_h - n_e)$ (with $q=1.6 \times 10^{-19}$ C) on the static electric field is ignored, so the static electric field is thus constant within the structure:

$$E_0 = \frac{V}{d}$$

Furthermore, LT-GaAs is a material in which carriers ($\tau$) present a sub-picosecond lifetime and low mobility ($\mu \approx 400$ square centimeters per volt per second (cm²N/s)), and thus the diffusion length $L_D$ is very short. Specifically $L_D = (D \times \tau)^{0.5}$ where $D = \mu \times kT/q \approx 10$ cm²/V/s is the diffusion coefficient and $\tau \approx 1$ picosecond (ps), giving $L_D \approx 30$ nm. Since this length is negligible compared with the absorption length, the optical wavelength, and the dimensions of the photodetector, it can be ignored in the diffusion process. Carrier densities are therefore directly proportional to the optical generation rate:

$$n_e(z) = n_h(z) = \Pi_{abs}(z) \times \tau \times \frac{1}{h\nu}$$

with hv being the photon energy, i.e. hv=1.59 electron volts (eV) for $\lambda=0.78$ µm, and $v_{abs}(z)$ is the absorbed power density.

Assuming that electrons and holes have identical saturation speeds $v_s$, the drift current I(z) in the component at depth z is given by:

$$I(z) = q[n_e(z) + n_h(z)] \times v_s \times S$$

$$I(z) - 2\frac{q}{h\nu} \Pi_{abs}(z) \times v_s \times S \times \tau$$

At this point, and following the reasoning of Feiginov (Michael N. Feiginov "Analysis of limitations of terahertz p-i-n uni-traveling-carrier photodiodes", J. Appl. Phys. 102, 084510 (2007)), the current $I_{ext}$ can be deduced, which current is the mean of the drift current in the structure.

$$I_{est} = \frac{1}{d}\int_0^d I(z)dz$$

Whence:

$$I_{ext} = -\frac{2}{d}\int_0^d \frac{q}{h\nu} \Pi_{abs}(z) \times v_s \times S \times \tau \times dz \Rightarrow I_{ext} =$$

$$\frac{2}{d} \times \frac{q}{h\nu} \times P_{abs} \times v_s \times \tau \Rightarrow \mathfrak{R}_m = \frac{I_{ext}}{P_{abs}} = \frac{A}{d}$$

With $$A = 2 \times \frac{q}{h\nu} \times v_s \times \tau \text{ and } P_{abs} = \int_0^d \frac{q}{h\nu} \Pi_{abs}(z) dz$$

This reproduces the above-mentioned result whereby the response coefficient R is inversely proportional to the interelectrode distance d.

Assuming the following values for LT-GaAs: $v_s=0.7 \times 10^7$ centimeters per second (cm/s) and $\tau=800$ fs, the following value is obtained for A: $A=70 \times 10^{-9}$ amp-meters per watt (Am/W).

In order to evaluate the gain in terms of generated THz power, consideration can be given to the situation immediately prior to destruction of the component using the expression for the maximum photocurrent $I_{0m}$:

$$I_{0m} = \frac{\Delta T_m}{R_{th}\left(\frac{1}{\Re_m} + E_{0sat} \times d\right)}.$$

Since $$\Re_m = \frac{A}{d},$$

it is possible to write:

$$I_{0m} = \frac{\Delta T_m}{R_{th} \times d \times \left(\frac{1}{A} + E_{0sat}\right)}.$$

With unchanging photoconductive material, $\Delta T_m$, $E_{0sat}$, and A are all constant. Thus, if the maximum current for a prior art planar structure of thickness $d_P$=2000 nm is written $I_{0mP}$ and if the maximum current for a vertical structure of the invention of thickness $d_V$=150 nm is written $I_{0mV}$, then the following resistance ratio is obtained:

$$\frac{R_{thP}}{R_{thV}} = 4 = > \frac{I_{0mV}}{I_{0mP}} = \frac{R_{thP} \times d_P}{R_{thV} \times d_V} = 53$$

Since the generated THz power is proportional to the square of the photocurrent, the invention makes it possible, at least in principle, to increase the power generated at 1 THz by a factor of $53^2 \approx 2800$.

Figure 6:
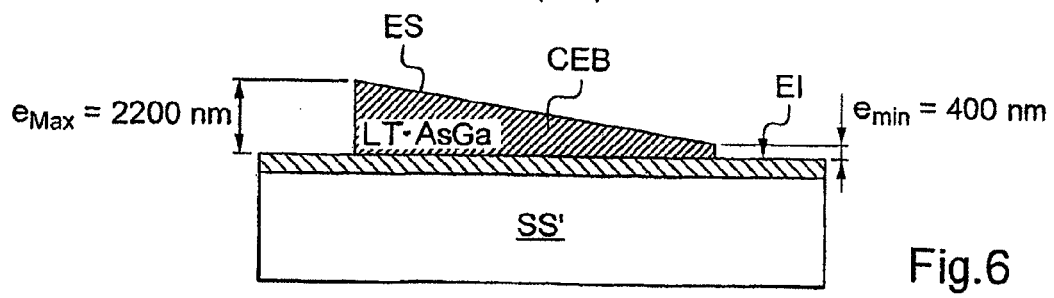
FIG. 6 is a diagrammatic section view of a device for measuring the response coefficient of a photodetector of the FIG. 3 type.

These results have been validated experimentally by continuously measuring the response of a vertical photodetector as a function of the interelectrode distance d on a given layer of LT-GaAs characterized by a lifetime τ for photogenerated carriers of about 800 fs. This thickness variation was achieved on a given sample by "chamfered" etching of a layer CE of LT-GaAs having a thickness of 2.2 μm transferred onto a substrate SS'. Thicknesses were thus obtained lying in the range $e_{min}$=0.3 μm to $e_{max}$=2.2 μm. The tested structure is shown in FIG. 6. The top and bottom metal electrodes ES and EI were made of gold and serve to enable the LT-GaAs layer to be biased.

Figure 7:
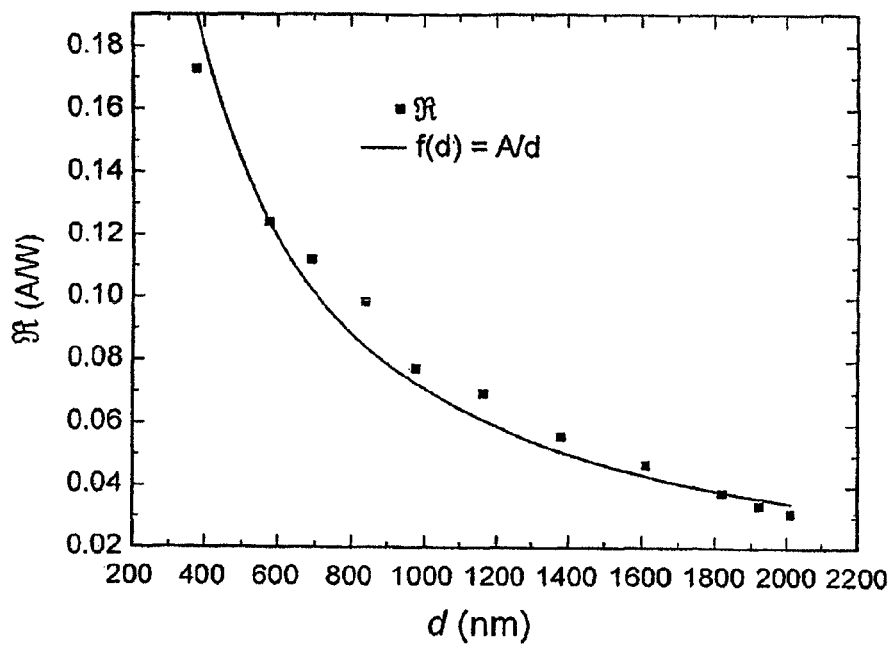
FIG. 7 shows the values of the response coefficient of a photodetector of the FIG. 3 type as measured experimentally using the device of FIG. 6.

FIG. 7 shows the measured response coefficient $\Re$ as a function of d for a bias voltage corresponding to an electrostatic field $E_0$=50 kilovolts per centimeter (kV/cm) and an optical power $P_0$=10 milliwatts (mW). The response varies almost as 1/d (continuous line representing the function A/d with A=7×10$^{-8}$ Am/W).

Figure 8:
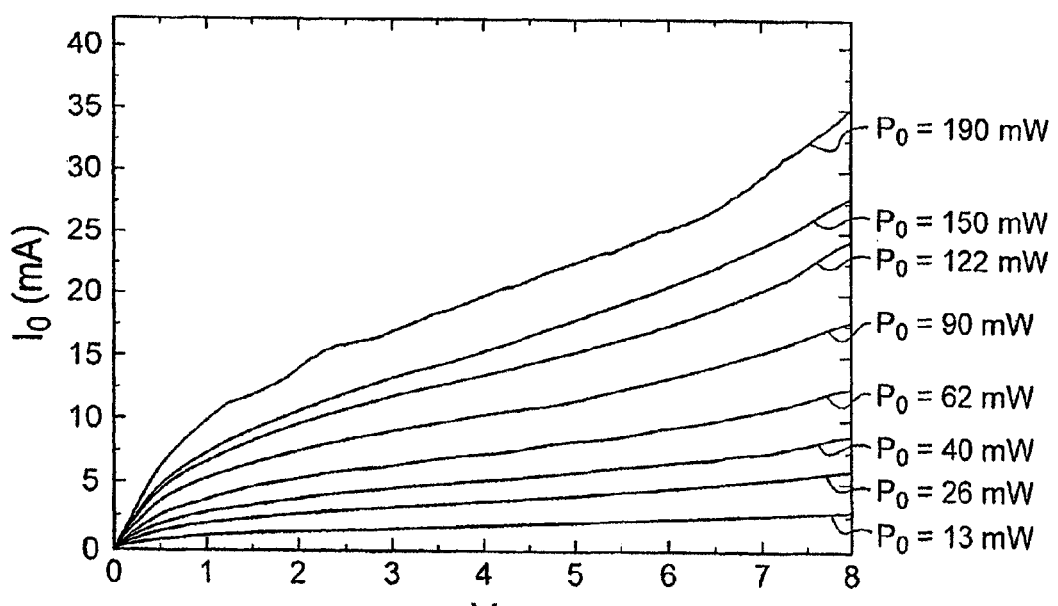
FIG. 8 is a graph showing the values of the photocurrent of a photodetector of the embodiment of the embodiment as a function of the bias voltage for various optical powers.

Furthermore, FIG. 8 shows that a maximum photocurrent of 35 milliamps (mA) for an optical power $P_0$=190 mW can be obtained with an interelectrode distance d=340 nm. This value is 10 to 20 times greater than the currents obtained using planar photodetectors.

Above consideration is given to a photodetector of the photoresistance type, however the scope of the invention is not limited to a device of this type. Other photodetectors suitable for implementing the invention, are constituted in particular by UTC photodiodes. These are PIN type photodiodes in which dynamic behavior is not limited by holes (generally slower). In this type of detector, absorption takes place in the P-type "base" and not in the intrinsic zone. For example, at λ=155 μm (i.e. at a photon energy $E_{ph}$ of 0.8 eV), the base may be made of InGaAs which presents a forbidden band $E_g$<$E_{ph}$, while the intrinsic zone and N zone may be made of InP having a forbidden band $E_g$>$E_{ph}$.

Figure 12:
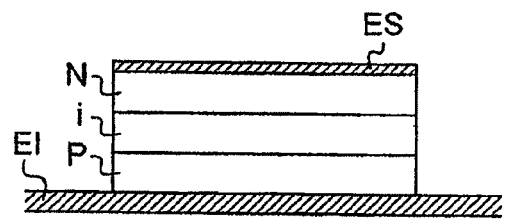
FIG. 12 is a diagrammatic section view of a photodetector of an alternative embodiment of the invention.

The main limitation of such diodes, when they are optimized for photomixing, is their low absorption of the light flux (a few percent). The thicker the absorbent zone, the greater the electron diffusion time. Furthermore, a large portion of the photon flux is absorbed by the titanium layer that is generally used as the contact layer of P zone. It is thus advantageous in accordance with the invention to put the P zone in an optical cavity formed by the (semitransparent) top electrode ES and the (totally reflective) bottom electrode EI, as shown in FIG. 12, thus making transfer possible onto a substrate having greater thermal conductivity.

The invention may also be applied to ordinary PIN photodiodes, however such detectors are generally not fast enough to be suitable for generating THz radiation by photomixing.

The above-mentioned photoconductive materials are given purely as non-limiting examples: other photoconductive materials suitable for making photodetectors of the invention can be identified by the person skilled in the art.

A "photomixer" is a device having an ultrafast photodetector PHD coupled with a THz antenna AT. A vertical structure photodetector may be coupled with numerous antennas known in the prior art. Nevertheless, it is preferable to associate it with a transverse electromagnetic horn antenna, as designed by the present inventors and described in Document FR 2 908 931.

Figure 13:
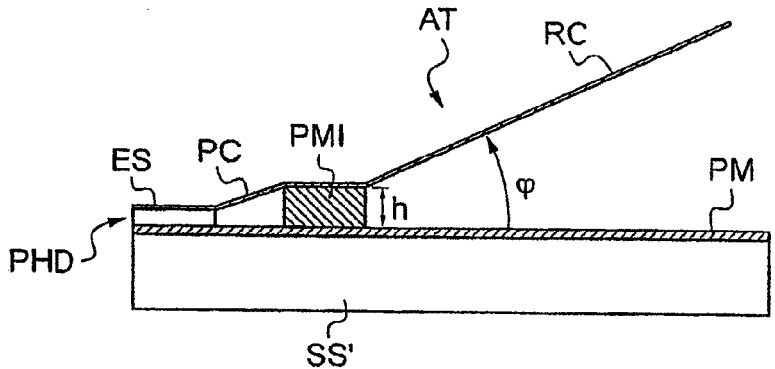
FIG. 13 is a diagrammatic section view of a photomixer in an embodiment of the invention.

Such an antenna AT has a ground plane PM constituted by a layer of metal deposited on an insulated substrate SS', and a conductive stripe RC extending over said ground plane and forming an acute angle φ relative thereto. Advantageously, the stripe RC widens going from its base (close to the ground plane) towards its end, thus enabling its impedance to be kept constant (typically at 50 Ω). This type of antenna is advantageous because it presents a broad passband; consequently, it is suitable for making a tunable THz radiation source. Furthermore, it is easy to associate a transverse electromagnetic horn antenna with a vertical photodetector as described above. This is shown in FIG. 13. A fixed gold layer PM constitutes both the bottom electrode of the photodetector PHD and the ground plane of the antenna. The conductive stripe RC, also made of gold, is separated from the ground plane by a stud PMI of insulating material ($SiO_2$, $Si_3N_4$, etc.) of height h generally lying in the range 100 nm to 10 μm, and it is connected to the top electrode of the photodetector by a metal "bridge" PC. This structure is "shielded": there is no loss by radiation in the substrate.

Figure 14:
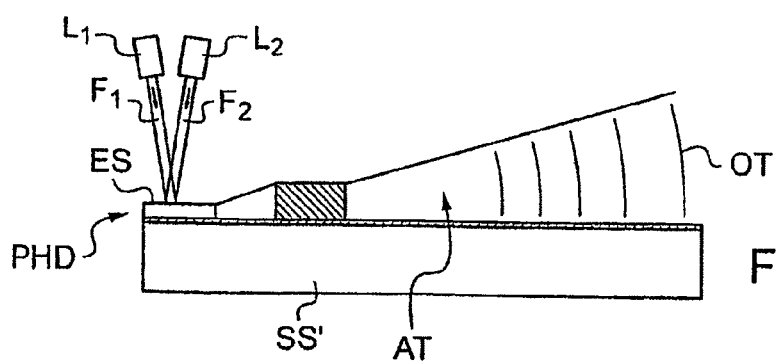
FIG. 14 is a diagrammatic view of a source of terahertz radiation in an embodiment of the invention.

FIG. 14 is a diagrammatic view of a THz radiation source constituted by a FIG. 13 photomixer and two laser radiation sources $L_1$ and $L_2$. The emission frequencies of the sources $L_1$ and $L_2$ are offset by a frequency in the range 100 GHz to 10 THz so as to enable beats to be generated in the THz range. They may be solid state or semiconductor lasers, possibly tunable lasers, and they preferably emit in the near infrared (800 nm-1550 nm). The light beams $F_1$ and $F_2$ emitted by these laser sources are superposed on the top electrode ES of the photodetector PHD in order to generate the THz beat. This may be achieved by free propagation in air or by guided propagation in an optical fiber or in planar light guides (integrated optics). As explained above, the beats between the two laser radiations generate photocurrent in the photodetector, which photocurrent includes a component at THz frequency, thereby exciting an electromagnetic wave TO of the same frequency in the horn antenna AT, which wave is emitted via the free end of the antenna.

In a variant, it is possible to use a single laser source oscillating between two longitudinal modes presenting a frequency difference lying in the range approximately 100 GHz-10 THz. This embodiment is most advantageous, in particular because of the fact that the two beams, corresponding to the two modes, are necessarily superposed and because their frequency difference is more stable than it would be if two independent sources were being used.

The invention claimed is:

1. A photomixer for generating THz radiation, the photomixer comprising a photodetector (PHD) coupled to an antenna (AT) for THz radiation, the photodetector comprising a layer (CE) of photoconductive material suitable for absorbing optical radiation, said layer presenting a thickness (e) less than the absorption length of said radiation by the photoconductive material and extending between a so-called "top" conductive electrode (ES) that is at least partially transparent to optical infrared radiation and a so-called "bottom" conductive electrode (EI) that is reflective, wherein said bottom and top conductive electrodes form a resonant cavity for said optical infrared radiation, and said top and bottom conductive electrodes (ES, EI) sandwiching the photoconductive material are metal conductive electrodes, and wherein said top conductive electrode has a thickness of 10 nm.

2. A photomixer according to claim 1, wherein the photodetector is transferred via said bottom electrode onto a substrate (SS') presenting thermal conductivity that is greater than the thermal conductivity of the photoconductive material.

3. A photomixer according to claim 1, wherein said photoconductive material is characterized by a lifetime of the photogenerated charge carriers that is shorter than 10 ps.

4. A photomixer according to claim 3, wherein said photoconductive material is selected from GaAs grown epitaxially at low temperature (LT-GaAs), LT-GaSbxAs 1-x (0<x<1), and irradiated InGaAs.

5. A photomixer according to claim 1, wherein said photodetector is of a type selected from a photoconduction detector and a uni-traveling carrier photodiode.

6. A photomixer according to claim 1, wherein said optical radiation is infrared having a wavelength lying in the range 700 nm to 1600 nm.

7. A photomixer according to claim 1, including a transparent dielectric coating (CP) over said top conductive electrode (ES).

8. A photomixer according to claim 1, wherein said layer of photoconductive material (CE) presents thickness (e) less than 1 µm.

9. A photomixer according to claim 1, wherein said THz radiation antenna (AT) is of the transverse electromagnetic horn type, having a ground plane (PM) and a conductive stripe (RC) extending over said ground plane and forming an acute angle (φ) relative thereto.

10. A photomixer according to claim 9, wherein said photodetector (PHD) is transferred onto an intrinsic semiconductor or dielectric substrate (SS') by means of its bottom conductive electrode (EI); wherein the ground plane (PM) of the antenna is constituted by an extension of said bottom conductive electrode, extending over said substrate; and wherein the conductive stripe (RC) extending over said ground plane is electrically connected to said top conductive electrode.

11. A THz radiation source comprising a photomixer according to claim 1 and at least one laser radiation source (L1, L2) arranged to direct two superposed beams (F1, F2) of laser radiation onto the top conductive electrode of the photodetector, said beams of laser radiation presenting a frequency difference lying in the range 100 GHz to 10 THz.

12. The use of a photomixer according to claim 1 for generating THz radiation by photomixing.

13. A photomixer according to claim 1, wherein said layer of photoconductive material (CE) presents thickness (e) less than 500 nm.

14. A photomixer according to claim 1, wherein said photoconductive material is characterized by a lifetime of the photogenerated charge carriers that is shorter than 1 ps.

15. A photomixer for generating THz radiation, the photomixer comprising a photodetector (PHD) coupled to an antenna (AT) for THz radiation, the photomixer comprising a layer (CE) of photoconductive material suitable for absorbing optical radiation, said layer presenting a thickness (e) less than 1 micrometer and extending between a so-called "top" conductive electrode (ES) that is at least partially transparent to optical infrared radiation and a so-called "bottom" conductive electrode (EI) that is reflective, wherein said bottom and top conductive electrodes forming a resonant cavity for said optical infrared radiation, and said top and bottom conductive electrodes (ES, EI) sandwiching the photoconductive material are metal conductive electrodes of gold, silver or copper, and wherein said top conductive electrode has a thickness of 10 nm.

16. A photomixer for generating THz radiation, the photomixer comprising a photodetector (PHD) coupled to an antenna (AT) for THz radiation, the photomixer comprising
   a layer (CE) of photoconductive material suitable for absorbing optical radiation;
   said layer presenting a thickness (e) less than the absorption length of said radiation by the photoconductive material and extending between a so-called "top" conductive electrode (ES) that is at least partially transparent to optical infrared radiation and a so-called "bottom" conductive electrode (EI) that is reflective,
   wherein said bottom and top conductive electrodes forms a resonant cavity for said optical infrared radiation, and said top and bottom conductive electrodes (ES, EI) sandwiching the photoconductive material are metal conductive electrodes, and
   wherein said top conductive electrode has a thickness of 10 nm and said bottom conductive electrode has a thickness greater than 150 nm.

17. A photomixer for generating THz radiation comprising a photodetector (PHD) coupled to an antenna (AT) for THz radiation,
   the photodetector comprising
   a layer (CE) of photoconductive material suitable for absorbing optical infrared radiation, said layer presenting a thickness (e) less than the absorption length of said radiation by the photoconductive material and extending between a so-called "top" conductive electrode (ES) that is at least partially transparent to optical infrared radiation and a so-called "bottom" conductive electrode (EI) that is reflective;
   wherein said bottom and top conductive electrodes forming a resonant cavity for said optical infrared radiation;
   and the antenna (AT) comprising
   a ground plane (PM) constituted by a layer of metal deposited on an insulated substrate (SS'),
   a conductive stripe (RC) extending over said ground plane and forming an acute angle relative thereto;
   wherein the conductive stripe RC is separated from the ground plane by a stud (PMI) of insulating material and is connected to the top conductive electrode of the photodetector by a metal "bridge" (PC); and wherein said ground plane constitutes both the bottom conductive electrode of the photodetector and the ground plane of the antenna.

\* \* \* \* \*